United States Patent
Wann et al.

(10) Patent No.: US 9,553,025 B2
(45) Date of Patent: Jan. 24, 2017

(54) SELECTIVE FIN-SHAPING PROCESS

(71) Applicant: TAIWAN SEMICONDUCTOR MANUFACTURING COMPANY, LTD., Hsinchu (TW)

(72) Inventors: Clement Hsingjen Wann, Carmel, NY (US); Ling-Yen Yeh, Hsinchu (TW); Chi-Yuan Shih, Hsinchu (TW); Yi-Tang Lin, Hsinchu (TW); Chih-Sheng Chang, Hsinchu (TW); Chi-Wen Liu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/598,276

(22) Filed: Jan. 16, 2015

(65) Prior Publication Data

US 2015/0132911 A1 May 14, 2015

Related U.S. Application Data

(63) Continuation of application No. 13/273,527, filed on Oct. 14, 2011, now Pat. No. 8,946,829.

(51) Int. Cl.
*H01L 21/8234* (2006.01)
*H01L 21/8238* (2006.01)
(Continued)

(52) U.S. Cl.
CPC ..... *H01L 21/823431* (2013.01); *H01L 21/265* (2013.01); *H01L 21/31111* (2013.01);
(Continued)

(58) Field of Classification Search
CPC ............. H01L 21/82343; H01L 21/265; H01L 21/3111;H01L 21/76224; H01L 21/823481; H01L 21/823821; H01L 21/845; H01L 27/088; H01L 27/0924; H01L 27/1211; H01L 29/06; H01L 29/78; H01L 29/66818; H01L 29/7853; H01L 29/7854
See application file for complete search history.

(56) References Cited

U.S. PATENT DOCUMENTS 7,224,029 B2  5/2007  Anderson et al.
8,242,568 B2  8/2012  Ikeda et al.
(Continued)

FOREIGN PATENT DOCUMENTS

JP    2005217418      8/2005
JP    2011151272      8/2011
KR    1020110050721   5/2011

OTHER PUBLICATIONS

Notice of Allowance of Patent dated Apr. 24, 2013 from corresponding application No. KR 10-2012-0006955. (English Translation Provided).

*Primary Examiner* — Michelle Mandala
(74) *Attorney, Agent, or Firm* — Hauptman Ham, LLP

(57) ABSTRACT

A method of forming a fin field-effect transistor (FinFET) includes forming a plurality of fins on a substrate. The method further includes forming an oxide layer on the substrate, wherein a bottom portion of each fin of the plurality of fins is embedded in the oxide layer, and the bottom portion of each fin of the plurality of fins has substantially a same shape. The method further includes shaping at least one fin of the plurality of fins, wherein a top portion of the at least one fin has a different shape from a top portion of another fin of the plurality of fins.

20 Claims, 9 Drawing Sheets

(51) Int. Cl.

| | | |
|---|---|---|
| *H01L 21/84* | (2006.01) | |
| *H01L 29/78* | (2006.01) | |
| *H01L 27/088* | (2006.01) | |
| *H01L 27/092* | (2006.01) | |
| *H01L 27/12* | (2006.01) | |
| *H01L 29/06* | (2006.01) | |
| *H01L 21/265* | (2006.01) | |
| *H01L 21/311* | (2006.01) | |
| *H01L 21/762* | (2006.01) | |
| *H01L 29/66* | (2006.01) | |

(52) U.S. Cl.
CPC ........... *H01L 21/76224* (2013.01); *H01L 21/823481* (2013.01); *H01L 21/823821* (2013.01); *H01L 21/845* (2013.01); *H01L 27/088* (2013.01); *H01L 27/0924* (2013.01); *H01L 27/1211* (2013.01); *H01L 29/06* (2013.01); *H01L 29/78* (2013.01); *H01L 29/66818* (2013.01); *H01L 29/7853* (2013.01); *H01L 29/7854* (2013.01)

(56) References Cited

U.S. PATENT DOCUMENTS

| | | | |
|---|---|---|---|
| 8,361,871 B2 | 1/2013 | Pillarisetty et al. | |
| 2004/0253775 A1 | 12/2004 | Achuthan et al. | |
| 2006/0046388 A1* | 3/2006 | Park .................. | H01L 21/28273 438/257 |
| 2008/0224178 A1 | 9/2008 | Pacha et al. | |
| 2009/0101982 A1* | 4/2009 | Nagatomo ........ | H01L 21/82380 257/368 |
| 2009/0261423 A1 | 10/2009 | Sawada | |
| 2009/0321833 A1 | 12/2009 | Basker et al. | |
| 2010/0187575 A1* | 7/2010 | Baumgartner .... | H01L 21/82343 257/255 |
| 2011/0298058 A1* | 12/2011 | Kawasaki .......... | H01L 29/7853 257/401 |
| 2012/0217467 A1* | 8/2012 | Tan .................. | H01L 21/28282 257/9 |
| 2012/0313169 A1* | 12/2012 | Wahl ................. | H01L 21/82343 257/347 |
| 2013/0015534 A1* | 1/2013 | Cheng .................. | H01L 21/845 257/401 |

\* cited by examiner

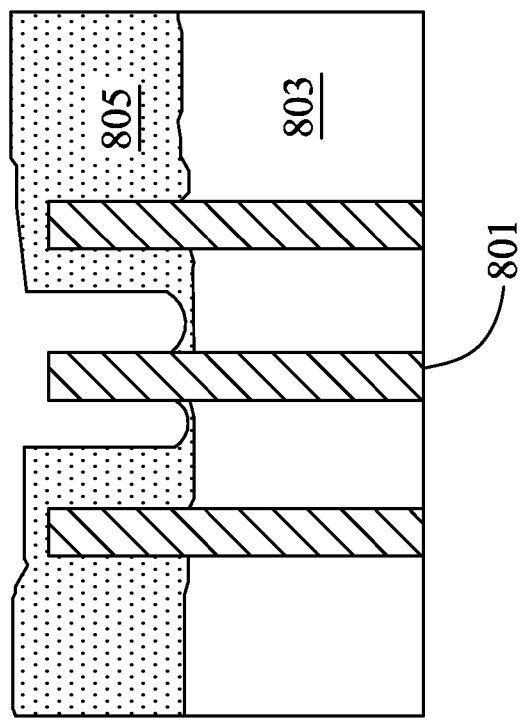
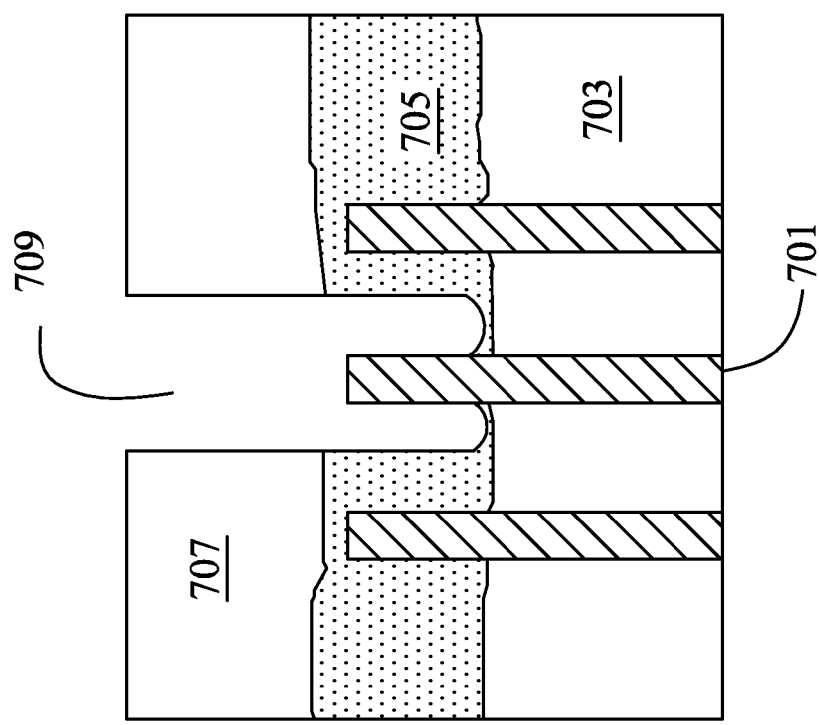

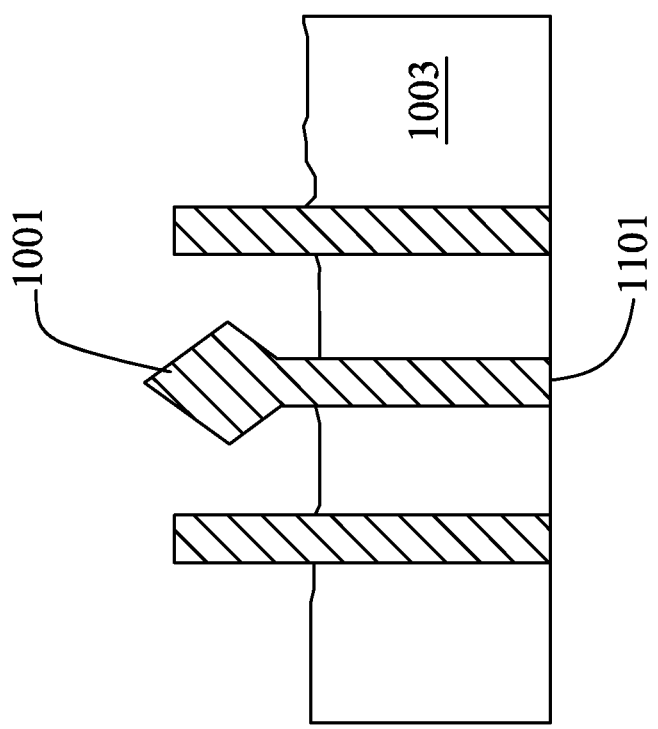

SELECTIVE FIN-SHAPING PROCESS

PRIORITY CLAIM

The present application is a divisional of U.S. application Ser. No. 13/273,527, filed Oct. 14, 2011, which is incorporated herein by reference in its entirety.

TECHNICAL FIELD

The disclosure relates generally to integrated circuit devices, and more particularly to structure and methods for forming fin field-effect transistors (FinFETs).

BACKGROUND

In the rapidly advancing semiconductor manufacturing industry, complementary metal oxide semiconductor (CMOS) FinFET devices may be used in many logic and other applications and are integrated into various different types of semiconductor devices. FinFET devices typically include semiconductor fins with high aspect ratios in which the channel and source/drain regions for the transistor are formed. A gate is formed over and along the sides of a portion of the semiconductor fins. The increased surface area of the channel and source/drain regions in a FinFET results in faster, more reliable and better-controlled semiconductor transistor devices.

New advanced designs are created with FinFET structures at the outset with computed-aided design (CAD) layers that define the boundary of each FinFET. As manufacturing process progresses into smaller and smaller technology nodes, devices originally designed in a larger technology node may benefit from manufacturing in a smaller technology node in ways such as increased performance and efficiencies and decreased die size. Similarly, devices designed using planar transistors can also reap benefits by manufacturing using FinFETs. However, because different design rules apply to planar structure layouts and FinFET structure layouts, converting portions of the device from a planar layout to a FinFET layout by hand may be akin to creating a new design and is highly resource intensive process. For product already being manufactured using planar transistors, a conversion that forms FinFETs that are at least electrical equivalents of the planar transistor is sought. As such, improved methods for automatically converting older planar structure layouts to FinFET structure layouts continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 7, 8, and 10 illustrate fin forming processes in accordance with various embodiments of the present disclosure.

DETAILED DESCRIPTION

Figure 1:
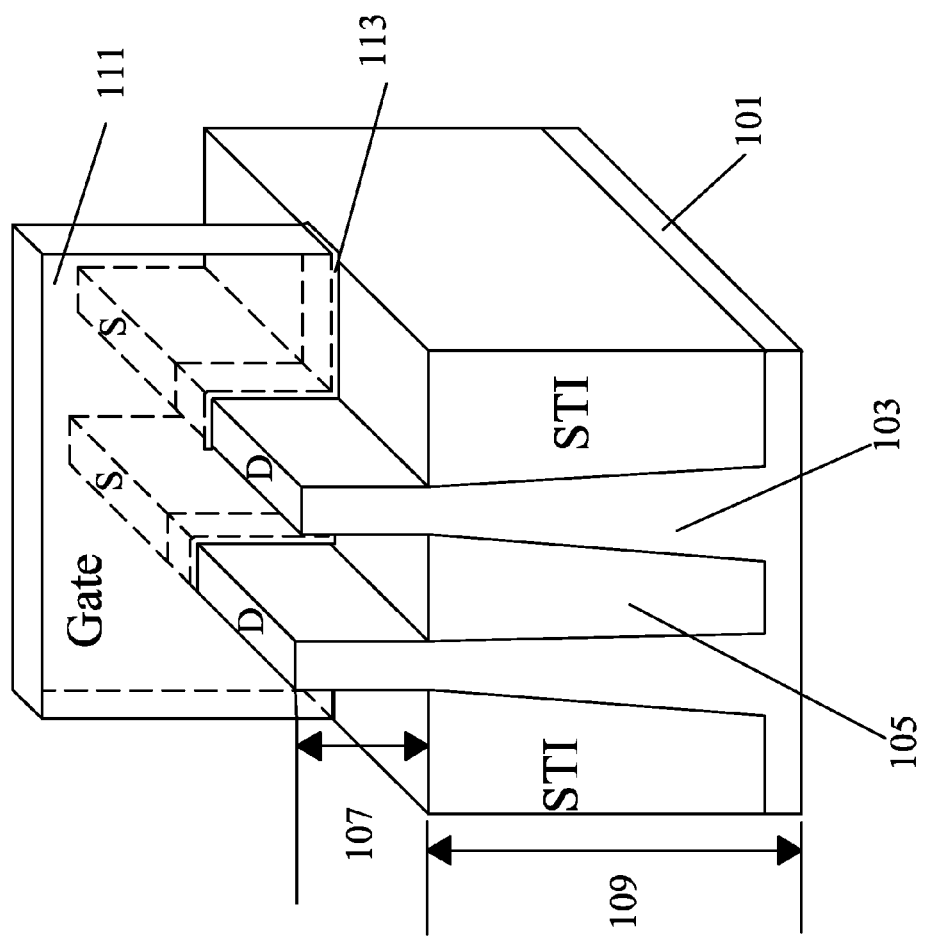
FIG. 1 illustrate a fin field-effect transistor (FinFET).

The making and using of illustrative embodiments are discussed in detail below. It should be appreciated, however, that the disclosure provides many applicable inventive concepts that can be embodied in a wide variety of specific contexts. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Of course, the description may specifically state whether the features are directly in contact with each other. In addition, the present disclosure may repeat reference numerals and/or letters in the various examples. The specific embodiments discussed are merely illustrative and do not limit the scope of the invention.

FinFETs use a substantially rectangular fin structure formed generally in one of two ways. In one method, shallow trench isolation (STI) features 105 are formed first on bulk silicon material, shown in FIG. 1 as substrate 101. The bottoms of the trenches between the STI features are exposed bulk silicon. Silicon is then grown in the trenches to form fins 103 by using, for example, an epitaxial process. Once a desired fin height is reached, then the STI 105 is etched to a level below the top of the fin to expose a portion of the fin. The exposed portion of the fin is a top portion 107 and the embedded portion is a bottom portion 109. The bulk silicon material 101 may be a silicon substrate or a deposited silicon such as silicon-on-insulator (SOI) with a barrier oxide (BOX) layer between the SOI and the underlying silicon substrate. Using this method, the STI features define the size and shape of the fins. Depending on etch parameters used when the trenches are formed, the fins may have a variety of substantially rectangular shapes, including the slight angle at the bottom portion of the fin as shown in FIG. 1.

In another method, bulk silicon on a substrate is etched into a rectangular fin shape by first patterning and depositing a hardmask layer on the bulk silicon. The hardmask forms a pattern covering the top of the fins. The bulk silicon is then etched to form trenches between the regions covered by the hardmask layer. The trenches are formed into shallow trench isolation (STI) features 105 by depositing a dielectric material, usually silicon oxide. The dielectric material is usually deposited in excess to completely cover the fins 103 and optionally the hardmask layer if not yet removed. The dielectric material is planarized down to the top surface of the fin/hardmask, and then etched to a level below the top of the fin so that a portion of the fin protrudes above the STI. The protruded fin portion is a top portion 107 and the embedded fin portion is a bottom portion 109.

In a variation of the second method, the hardmask for etching in to the bulk silicon is formed by a process using mandrels. A photoresist pattern is formed and used to etch a mandrel pattern. A conformal spacer material is then deposited around the mandrel. The conformal spacer is usually formed of a hardmask material forming a spacer sidewall thinner than that of the mandrel. The mandrel material between the spacers is then removed in subsequent etching operations to leave just the spacers behind. Some of the spacers are then used as a hardmask for etching the underlying silicon layers to form the fin structures. Using the mandrel/spacer method, thinner fins that are closer together can be formed than the first method or an unmodified second method. The exposed fin portions 107 has a height dimension (h), a width dimension (w) and a length dimension (l). Some electrical properties of the FinFET can be defined relative to these dimensions. For example, an effective channel width for the transistor may be calculated using the dimension of the fins under the gate. As shown in FIG. 1, the effective channel width is 2 fins, or 2×(2h+w). Note that the effective channel width does not include the distance between fins. These fins are referred to herein as regular fins because they all have the same height and width dimensions.

The remaining FinFET forming process steps are described here to provide context for the present disclosure. A gate dielectric layer 113 and gate electrode layer 111 are deposited over the narrowed fins and the STI layer. Gate dielectric layer 113 is formed of a high dielectric constant (high-k) dielectric material. The exemplary high-k materials may have k values greater than about 4.0, or even greater than about 7.0, and may include aluminum-containing dielectrics such as $Al_2O_3$, HfAlO, HfAlON, or AlZrO; Hf-containing materials such as $HfO_2$, $HfSiO_x$, $HfAlO_x$, $HfZrSiO_x$, or HfSiON; and/or other materials such as $LaAlO_3$ or $ZrO_2$. Gate electrode layer 111 is formed on the gate dielectric layer 113, and may be formed of a conductive material such as doped polysilicon, metals, or metal nitrides.

The gate electrode layer 111 and gate dielectric layer 113 are then patterned to form gate stacks over a middle portion of the fins. The fin portions not under the gate stacks are then optionally doped to form lightly doped drain and source (LDD) regions. The dopant used depends on the conductivity type of the transistor. The LDD regions may be doped by ion-implanting or by plasma doping where dopants are deposited onto the fin and annealed. Source and drain regions are formed across the gate stack. Source and drain regions may be formed by ion-implanting a source/drain region or by removing a portion of the fin and epitaxially re-growing the removed portion under doping conditions to form a source/drain region.

A circuit designer specifies transistors in his design according to electrical properties for performing various functions. Electrical properties to be considered include turn on voltage (threshold voltage), breakdown voltage, on-state current ($I_{on}$), leakage current, among others. The on-state current is the current that may be driven through the transistor when the gate voltage is equal to the threshold voltage. The on-state current is proportional a channel width. When a circuit is designed using planar transistors, the channel width may be any value by just making the transistor wider or narrower. However, with FinFETs, the channel widths cannot be just any value—the channel width is an integer multiple of the dimensions for a single fin. For example, a FinFET channel width may equal to 2 fin or 3 fin but not 2.5 fins. When a planar transistor-based design is converted to a FinFET-based design, the planar transistor cannot be converted to a FinFET having exactly the same on-state current. While usually a range of on-state currents may be acceptable, depending on the circuit functionality and application, limiting choices of channel width for a FinFET reduces design flexibility and planar-to-FinFET conversion accuracy.

Various embodiments of the present disclosure pertain to a selective fin-shaping process to allow individual fin width and fin height control. By shaping one or more fins in a FinFET, the channel width of a FinFET may vary beyond an integer multiple of a single fin dimension. The selective fin-shaping may enlarge one or more fins, shorten one or more fins, thin one or more fins, reduce all fin dimensions at the same time, or change the shape of one or more fins some other way to create shaped fins while other regular fins remain unchanged. For example, the equivalent of a FinFET having 2.5 fins may be designed by reducing the size of one fin. Benefits may include improved circuit design flexibility and FinFET process margin for designers and foundries that are transferring from a planar-based design to a FinFET-based design.

Figure 2:
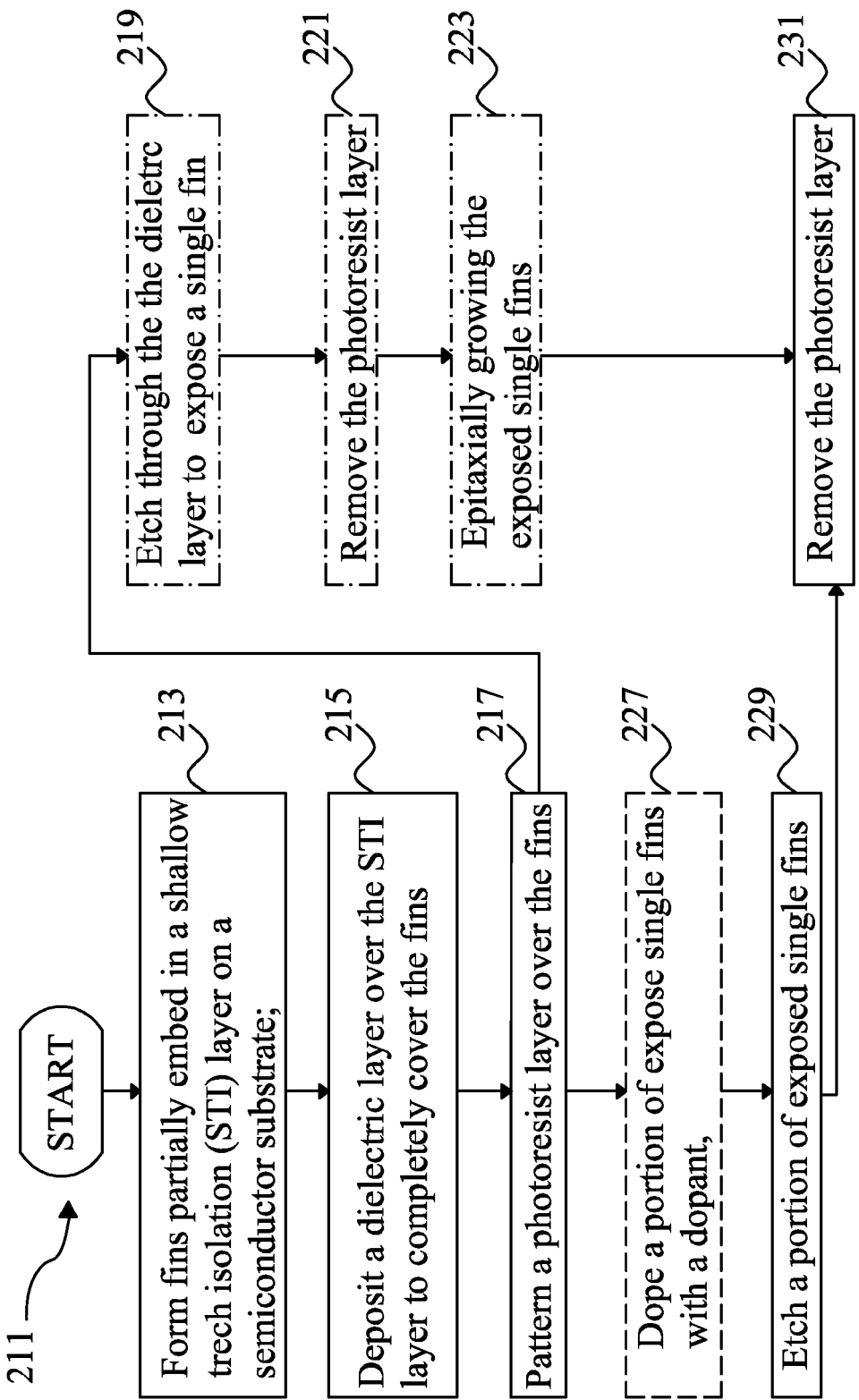
FIG. 2 illustrates a flowchart of a method for fabricating FinFET structures in accordance with various embodiments of the present disclosure.

Referring to FIG. 2, a process flow 211 for selective fin-shaping is shown. At operation 213, fins partially embedded in shallow trench isolation (STI) layers are formed on a semiconductor substrate. As discussed herein, a number of methods may be used to form the fins. The fins may be etched from a bulk silicon or grown expitaxially.

Figure 3B:
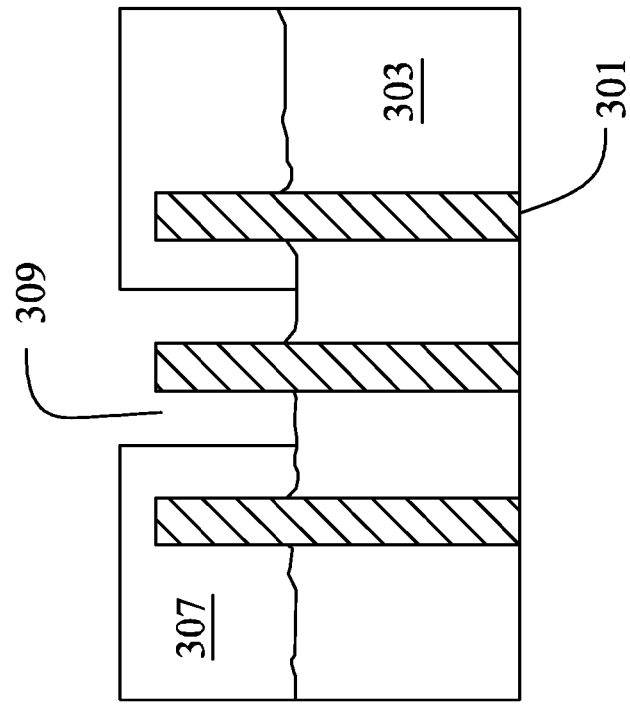
FIGS. 3A and 3B illustrate partially fabricated FinFETs in accordance with various embodiments of the present disclosure.
Figure 3A:
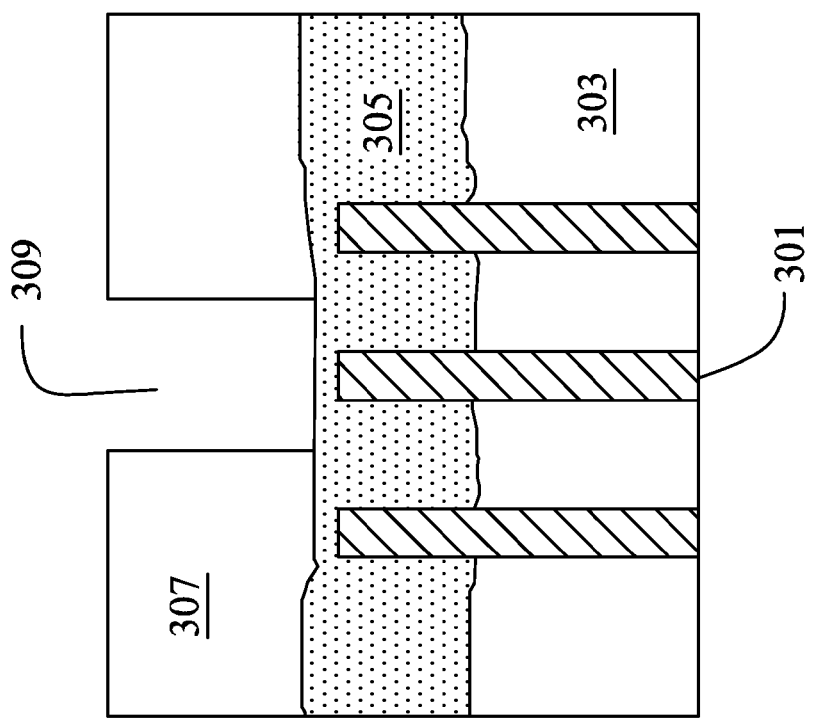

In operation 215, an optional dielectric layer is deposited over the STI layer to completely cover the fins. The optional dielectric layer is used if the one or more fins are to be enlarged. If the one or more fins are to be reduced, then the optional dielectric layer is not necessary. The optional dielectric layer may be a silicon oxide, silicon nitride, or another dielectric layer that is easier to etch than the underlying STI layer. In some cases, an etch stop layer may be deposited before the dielectric layer. In such case, the dielectric layer may be the same material as the STI layer. FIG. 3A illustrates a partially fabricated FinFET structure after operation 215. The fins 301 are partially embedded by STI layer 303. The dielectric layer 305 is deposited over the STI layer 303 and completely covers the fins 301.

Referring back to FIG. 2, in operation 217 a photoresist layer is patterned over the fins. Lithographic dimensions limit a minimum size that a photoresist layer may protect and a minimum size opening that a photoresist pattern may create. The minimum opening is smaller than the minimum area to be protected. In other words, an opening may be created with a dimension of one fin pitch, but the opposite, of a protective area covering one fin pitch may be too small. In FIGS. 3A and 3B, a photoresist layer 307 is deposited and patterned to create an opening 309. If the dielectric layer of operation 215 is deposited, the photoresist is deposited over the dielectric layer as shown in FIG. 3A. If the dielectric layer of operation 215 is not deposited, then the photoresist is deposited directly over the STI layer and the fins as shown in FIG. 3B.

Referring back to FIG. 2, in optional (broken line) operation 227 a portion of the exposed single fin is doped with a dopant. Depending on the portion to be doped, a number of doping processes may be used. In one embodiment, a small vertical portion at the very top of the fin may be doped by using an ion implant process. Dopant ions are directed at the opening, but because of the aspect ratio of the opening, mostly the top portion of the fin would be doped, shown as fin tip 401 in FIG. 4A. The dopant may be oxygen to form a silicon oxide fin tip. The dopant may be nitrogen, to form a silicon nitride tip. Other dopants that effectively change the chemical property of the fin tip 401 so that it can be easily removed in a subsequent etching procedure may be used.

Figure 4B:
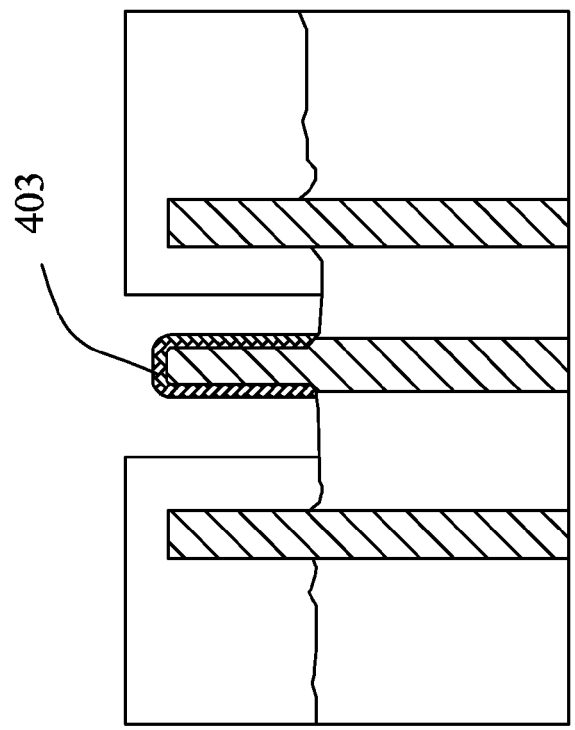
FIGS. 4B, 5B, and 6B illustrate fin thinning embodiments in accordance with the present disclosure.
Figure 4A:
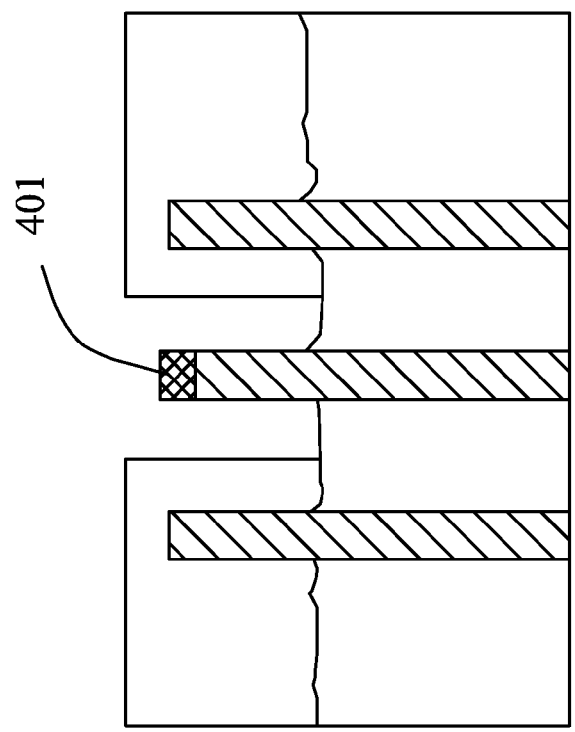
FIGS. 4A, 5A, and 6A illustrate fin shortening embodiments in accordance with the present disclosure.

In other embodiments, a conformal plasma doping process is used to convert an outer layer 403 of the fin to a different material, as shown in FIG. 4B. The plasma may be generated in situ or remotely. For example, an oxygen plasma may be used to oxidize an outer layer portion of the fin. Plasmas including other dopants may also be used to effectively change the chemical property of an outer layer 403 of the fin so that the layer 403 can be easily removed in a subsequent etching procedure.

Referring back to FIG. 2, in operation 229, a portion of the exposed single fins is etched and removed. The portion removed may be the portion doped in operation 227. Depending on the type of doping processes and the etch selectivities of various materials, a number of etching processes may be used.

In some embodiments, the portion to be removed is located mostly at the tip of the fin. These embodiments may be used to shorten one or more of the fins in the FinFET, but not changing the width of the fins very much. Various types of plasma etching may be used to remove doped portions from a fin tip. In one example of FIG. 4A where the portion to be removed is at the fin tip, a biased plasma may be used to remove the material at the tip of the fin. Depending on the material to be removed, the plasma may include reactive species such as hydrogen and fluorine, for example with a fluorocarbon plasma. The plasma may also alternatively or in addition include relative inert species such as nitrogen, argon, krypton, or xenon. For example, if the fin tip is silicon oxide, an anisotropic plasma etching may include a fluorine-based etchant. Note that the plasma etchant should have an etching preference for the silicon oxide at the tip of the fin relative to the silicon oxide in the STI layer below and for the silicon on the fin so as not to remove much of the STI layer and shape the fin in undesirable ways. Incidental etching of the STI layer may be minimized by biasing at a low power toward the substrate, by directing the plasma toward the substrate at an angle so that most of the incident angles are blocked by the photoresist, and also by selecting the dopant and the STI material to have different etch selectivities.

Figure 5A:
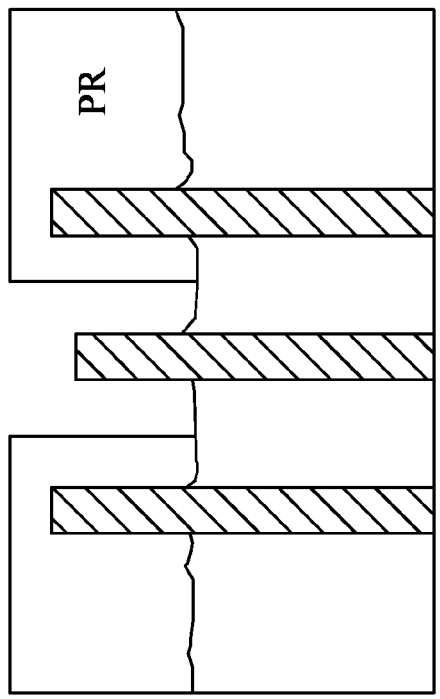

In another example, the fin tip may be silicon nitride if the dopant was nitrogen. Plasma etching of silicon nitride with relative high etch selectivity of silicon nitride over silicon oxide may include some fluorine-based plasma along with methane, nitrogen, and oxygen additive gas flows. One skilled in the art can tune the gas mixture so that little or no STI layer is removed relative to the silicon nitride at the fin tip. After the doped fin tip is etched away, the resulting structure may be that of FIG. 5A, where the exposed single fin is shorter than neighboring fins that are protected.

The doped fin tip may also be removed by wet etching methods. In wet etch, one or more substrates is bathed in an etchant baths that may also be agitated to promote etchant contact with the surface to be etched. Wet etchants generally attack all exposed surfaces, so the wet etchant should have a relatively high etch selectivity for etching the fin tip material against other parts of the structure. For example, for silicon oxide fin tips, the wet etchant may include hydrofluoric acid or a fluorocarbon etchant. For silicon nitride fin tips, the wet etchant may include phosphoric acid.

Figure 5B:
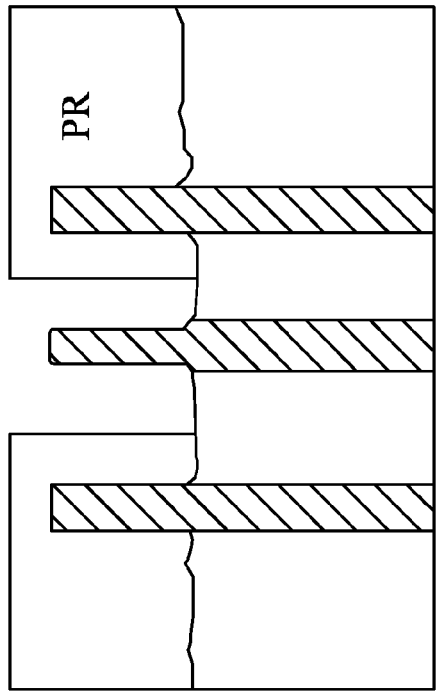

In some embodiments, the portion to be removed is an outer layer of the fin as shown in FIG. 4B. Appropriate isotropic etching methods include dry etching methods using plasma or wet etching methods. For example a silicon oxide outer layer may be removed by using a buffered oxide etch or a mixture of ammonium fluorixde and hydrofluoric acid in a wet etch. Plasma etching may involve non-biased plasma, including remotely generated plasma to remove an outer layer. For example, a remotely generated $SF_6$ plasma with oxygen may be used. After the doped outer layer portion is etched away, the resulting structure may be that of FIG. 5B, where the exposed single fin is thinner and somewhat shorter than neighboring fins that are protected under the photoresist.

In still other embodiments, a portion of exposed single fins is etched without first doping a portion of the fins. Various etching methods may be applied directly to the silicon fin to change its shape. The various etching methods may be categorized into dry etch and wet etch, isotropic and anisotropic, and different combinations resulting in different shapes.

In one example, plasma etch using various fluorine-based plasma such as $XeF_2$ and $BrF_3$ may be used to isotropically reshape the exposed fin. The effect would be similar to first oxidizing the fin using oxygen containing plasma and then etching the silicon oxide layer.

In another example, plasma etch using polymerization techniques can result in moderately anisotropic etching targeting only a top portion of the fin. Polymer byproducts from etching deposits on the sidewalls creates a protect layer. With this technique, the polymer residue must be removed in subsequent processing. Carbon-rich fluorocarbon or hydrofluorocarbon plasma may be used.

In another example, wet etching using anisotropic etchants can shape the fin according to crystal orientation. Anisotropic wet etching that removes silicon at orientation plane dependent rates includes using tetramethylammonium hydroxide (TMAH), potassium hydroxide (KOH) or another strong alkaline etchant (pH>12) to etch silicon. Because the bonding energy of silicon atoms is different for each crystal plane, these etchants therefore have high sensitivity between certain orientation planes in an etch rate limited, not diffusion limited, reaction. A TMAH wet etch results in a notch opening. The orientation dependence of KOH wet etch is similar to TMAH, but with different rates and ratios. In one example, the etchant includes TMAH and KOH with the TMAH at about 20% by weight.

In yet another example, isotropic wet etching can uniformly remove silicon from all directions that is not protected. Isotropic silicon etching may use a combination of hydrofluoric acid (HF) with a number of additives such as nitric acid ($HNO_3$), citric acid ($CH_3COOH$), sodium chlorite ($NaClO_2$), perchloric acid ($HClO_4$), fresh potassium permanganate ($KMnO_4$), or combinations of these additives. These chemical mixtures tend to uniformly remove material, and are limited by the mass transport (diffusion limited) of chemical species to the crystal surface.

Figure 6A:
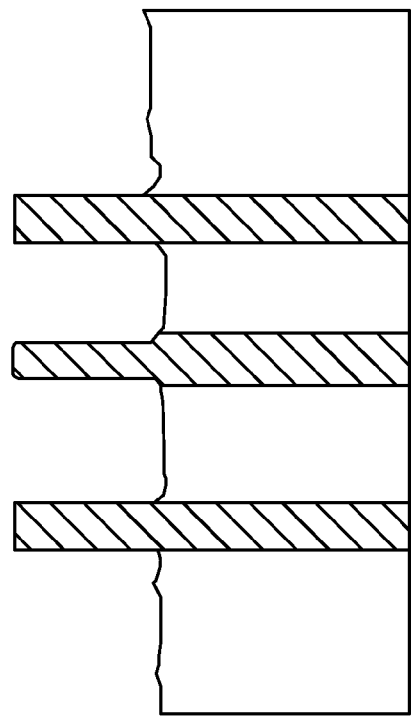
Figure 6B:
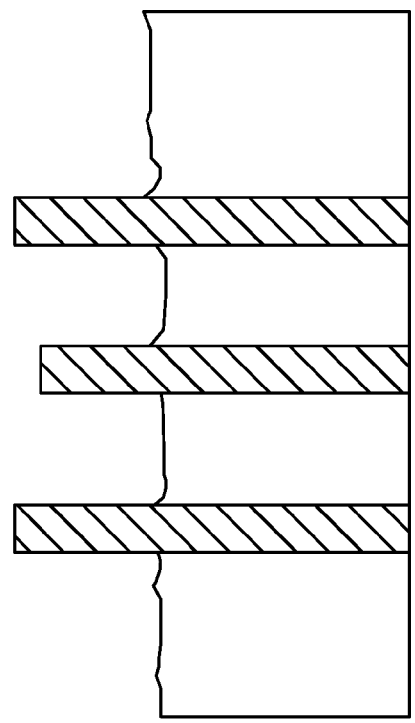

Referring back to FIG. 2, in operation 231 the photoresist layer is removed. The photoresist removal is accomplished using an ashing process known in the art. Examples of result fin structure are shown in FIGS. 6A and 6B. In FIG. 6A, the FinFET includes 3 fins, with 2 regular fins and 1 shaped fin. The shaped fin has a shorter top portion. In FIG. 6B, the FinFET also includes 3 fins, with 2 regular fins and 1 shaped fin. The shaped fin has a narrower top portion that may be the same, slightly shorter, or longer than the neighboring regular fins. The bottom portions of all three fins are substantially the same, because the bottom portions are not shaped. Note that while the shaped fin may be shorter than the regular fins, the top portion of the shaped fin may be the same length or longer than the top portion of regular fins because the STI layer is also etched and more of the top portion of the shaped fin may be exposed.

The various etching methods discussed herein can shape the exposed fin a number of ways to create a profile that reduces the fin height and/or width. The change in profile then allows a FinFET to have an effective channel width that is not an integer multiple of a regular fin. Depending on the desired effective channel width, the etching method would be chosen to minimize processing and maximize process control.

In the embodiments where the fin width is reduced, an additional benefit is to increase the distance between adjacent fins. Increasing the distance between fins increases the process window for the gate formation. The FinFET gate may include many layers of different materials deposited over a middle portion of the fins. Each layer increases the aspect ratio of the remaining space between the fins so that the last layer may be difficult to deposit fully without voids. Increasing the distance between fins decreases the initial aspect ratio so that the last deposition process window is larger.

Still referring to FIG. 2, an alternate embodiment to shape the exposed single fin by enlarging the fin is shown in operations 219 to 223. In operation 219, the dielectric layer from operation 215 is etched through to expose a single fin. The dielectric layer is used to protect regular fins while the exposed fin is enlarged. FIG. 7 illustrates the structure after the dielectric layer 705 is etched down the STI layer 703, forming an opening 709 containing one single fin 701. The photoresist layer 707 is then removed in operation 221 of FIG. 2 as shown in FIG. 8. The photoresist is removed in operation 221 because the epitaxy temperature is very high, above a temperature suitable for photoresist material. Note that for epitaxial growth of fin 801, the dielectric layer 805 may be a silicon oxide and in some cases silicon nitride.

Figure 9A:
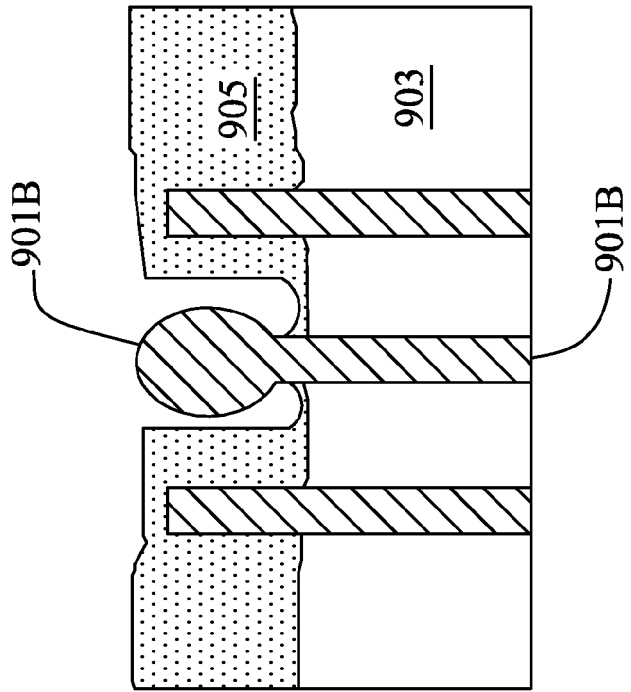
FIGS. 9A and 9B illustrate fin shaping processes in accordance with various embodiments of the present disclosure.
Figure 9B:
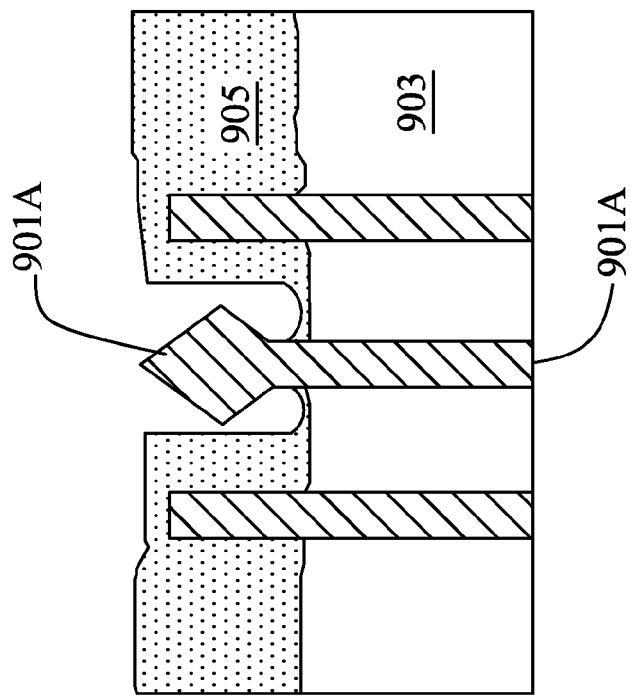

In operation 223, silicon is grown on the exposed fin surfaces during an epitaxial growth process. No silicon is grown on surfaces covered by the dielectric layer 805. The photoresist is removed in operation 221 because the epitaxy temperature is very high, above a temperature suitable for photoresist material. FIGS. 9A and 9B illustrate different results from the operation 223. In FIG. 9A, the single-crystal growth extends the surfaces of the exposed fin according crystal orientations, forming a shaped fin 901A. The various tip angles of fin 901A depends on the crystal orientation of the fin. In some embodiments, the fin tip shape may be controlled to form a different shape, such as that of FIG. 9B. During epitaxial growth, additional gas that etches certain surfaces may be included to shape the growth. A bulb-tip shape such as that of fin 901B may be formed by tuning the epitaxial recipe with various flows of hydrochloric acid gas.

Referring back to FIG. 2, in operation 231 the photoresist layer is removed. The photoresist removal is accomplished using an ashing process known in the art. An example of resulting fins is shown in FIG. 10, showing the shaped fin 901A. In FIG. 10, the FinFET includes 3 fins, with 2 regular fins and 1 shaped fin. The shaped fin has an angular face that corresponds to the crystal orientation of the silicon. The effective channel width of the FinFET of FIG. 10 is increased compared to one having 3 regular fins.

The various embodiments of the present disclosure are discussed herein in reference to one FinFET with 3 fins. In reality a FinFET may have any number of fins from 1 to several or even hundreds. The present disclosure is not limited a FinFET having a particular number of fins. For a single-fin FinFET, the only fin is the shaped fin. For a two-fin FinFET, one or both of the fins may be shaped. For a three-fin FinFET, the middle fin may be shaped. As discussed, while a single fin opening may be formed in a photoresist, having a photoresist protecting only one fin may be too small for current lithography processes. Thus, for FinFETs having more than 3 fins, the shaped fin may be spaced apart from regular fins by 2 regular fins. A four-fin FinFET may include shaped fins at either end and two regular fins in the middle. Alternatively, more than one fin may be shaped in the same opening. Thus a four-fin FinFET may also included shaped fins in the middle and regular fins at either end. Of course, three fins may be shaped or three fins may be regular, or all of the fins may be shaped or may be regular.

An integrated circuit apparatus includes many transistors. The apparatus may include many FinFETs of different sizes having different number of fins. Some FinFETs may have shaped fins and some FinFETs may not. A FinFET may have more than one type of shaped fins, for example, a five-fin FinFET may have 2 regular fins, 2 fins shaped a particular way, and 1 fin shaped a different way. While the process may be repeated to shape fins any number of times, each time the fin-shaping process uses manufacturing resources including one photomask and one to several depositions and etching processes.

One aspect of this description relates to a method of forming a fin field-effect transistor (FinFET). The method includes forming a plurality of fins on a substrate. The method further includes forming an oxide layer on the substrate, wherein a bottom portion of each fin of the plurality of fins is embedded in the oxide layer, and the bottom portion of each fin of the plurality of fins has substantially a same shape. The method further includes shaping at least one fin of the plurality of fins, wherein a top portion of the at least one fin has a different shape from a top portion of another fin of the plurality of fins.

Another aspect of this description relates to a method of forming a fin field-effect transistor (FinFET). The method includes forming a plurality of fins partially embedded in a shallow trench isolation (STI) layer on a semiconductor substrate. The method further includes patterning a photoresist layer over the plurality of fins to form one or more openings exposing a single fin. The method further includes shaping the exposed single fin.

Still another aspect of this description relates to a method of forming a fin field effect transistor (FinFET). The method includes forming a first fin having an upper portion and a lower portion, and forming a first gate structure over the first fin. The method further includes forming a second fin having an upper portion and a lower portion, wherein a shape of the upper portion of the first fin is different from a shape of the upper portion of the second fin, and forming a second gate structure over the second fin. The method further includes forming an isolation feature between the first fin and the second fin, wherein the lower portion of the first fin and the lower portion of the second fin are both embedded in the isolation feature.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a fin field-effect transistor (FinFET), the method comprising:
    forming a plurality of fins on a substrate;
    forming an oxide layer on the substrate, wherein a bottom portion of each fin of the plurality of fins is embedded in the oxide layer, and the bottom portion of each fin of the plurality of fins has a same shape; and
    shaping at least one fin of the plurality of fins, wherein a top portion of the at least one fin has a different shape from a top portion of another fin of the plurality of fins, wherein shaping the at least one fin comprises epitaxially growing undoped silicon on the top portion of the at least one fin.

2. The method of claim 1, further comprising forming a gate structure over each fin of the plurality of fins.

3. The method of claim 1, wherein shaping the at least one fin of the plurality of fins comprises reducing a height of the top portion of the at least one fin above the oxide layer.

4. The method of claim 1, wherein shaping the at least one fin of the plurality of fins comprises increasing a width of the top portion of the at least one fin.

5. The method of claim 1, wherein shaping the at least one fin comprises rounding a top surface of the at least one fin.

6. A method of forming a fin field-effect transistor (FinFET), said method comprising:
    forming a plurality of fins partially embedded in a shallow trench isolation (STI) layer on a semiconductor substrate;
    patterning a photoresist layer over the plurality of fins to form one or more openings exposing a single fin; and,
    shaping the exposed single fin, wherein shaping the exposed single fin comprises etching a portion of the exposed single fin.

7. The method of claim 6, wherein shaping the exposed single fin comprises:
    doping a portion of the exposed single fin with a dopant; and
    etching the doped portion of the exposed single fin.

8. The method of claim 6, further comprising:
    depositing a dielectric layer over the STI layer to completely cover the plurality of fins, wherein the patterned photoresist layer is over the dielectric layer;
    etching the dielectric layer to expose the single fin;
    removing the photoresist layer; and,
    shaping the exposed single fin.

9. A method of forming a fin field effect transistor (FinFET), the method comprising:
    forming a first fin having an upper portion and a lower portion;
    forming a first gate structure over the first fin;
    forming a second fin having an upper portion and a lower portion, wherein a shape of the upper portion of the first fin is different from a shape of the upper portion of the second fin;
    forming a second gate structure over the second fin, wherein forming the first gate structures comprises forming the first gate structure continuous with the second gate structure; and
    forming an isolation feature between the first fin and the second fin, wherein the lower portion of the first fin and the lower portion of the second fin are both embedded in the isolation feature.

10. The method of claim 9, wherein forming the first fin comprises forming the first fin having a width of the upper portion less than a width of the upper portion of the second fin.

11. The method of claim 9, further comprising:
    forming a third fin having an upper portion and a lower portion, wherein the lower portion of the third fin is embedded in the isolation structure, and the second fin is between first fin and the third fin; and
    forming a third gate structure over the third fin.

12. The method of claim 11, wherein forming the third fin comprises forming the upper portion of the third fin having a same shape as the upper portion of the first fin.

13. The method of claim 11, wherein forming the third fin comprises forming the upper portion of the third fin having a different shape from the shape of the upper portion of the first fin.

14. The method of claim 1, wherein epitaxially growing the undoped silicon on the top portion of the at least one fin comprises tuning an etching gas during the epitaxially growing.

15. The method of claim 14, wherein tuning the etching gas comprises tuning hydrochloric acid gas.

16. The method of claim 1, further comprising forming a continuous gate structure over the plurality of fins.

17. The method of claim 7, wherein doping the portion of the exposed single fin comprises doping a sidewall of the exposed single fin adjacent to the STI layer.

18. The method of claim 7, wherein doping the portion of the exposed single fin comprises doping less than an entirety of a width of the portion of the exposed single fin.

19. The method of claim 6, further comprising forming a continuous gate structure over the plurality of fins.

20. The method of claim 9, further comprising:
    doping an entirety of a sidewall of the upper portion of the first fin to form a doped region; and
    removing the doped region.

* * * * *